United States Patent [19]

Embree et al.

[11] 4,330,744
[45] May 18, 1982

[54] PRECISION CONVERTER/ISOLATION CIRCUIT

[75] Inventors: Milton L. Embree, Reading; Earl O. Martin, Temple, both of Pa.

[73] Assignee: Bell Telephone Laboratories, Incorporated, Murray Hill, N.J.

[21] Appl. No.: 216,927

[22] Filed: Dec. 16, 1980

[51] Int. Cl.³ ............................................. G05F 3/20
[52] U.S. Cl. .................................... 323/316; 307/297; 330/296
[58] Field of Search .................. 307/296 R, 297, 310, 307/313, 491, 500; 323/304, 311–316; 330/296, 297

[56] References Cited

U.S. PATENT DOCUMENTS

| | | | |
|---|---|---|---|
| 3,825,774 | 7/1974 | Van Kessel et al. | 307/313 X |
| 3,909,628 | 9/1975 | Muto | 323/315 X |
| 4,004,247 | 1/1977 | Van De Plassche | 323/315 X |
| 4,122,403 | 10/1978 | Cave | 330/296 |
| 4,268,759 | 5/1981 | Gilbert | 307/310 X |

OTHER PUBLICATIONS

McClellan, "Current Source and 555 Timer Make Linear VTOF Converter," Electronics, Jun. 10, 1976, pp. 108, 109, 323–316.

*Primary Examiner*—A. D. Pellinen
*Attorney, Agent, or Firm*—J. M. Graziano

[57] ABSTRACT

The subject circuit is a converter/isolation circuit which employs only a few components yet functions to monitor a particular signal and produce an output signal which is identical to or proportional to (to a high degree of accuracy) to the monitored input signal. The subject circuit monitors a voltage and generates both a current and a voltage as output signals.

19 Claims, 3 Drawing Figures

PRECISION CONVERTER/ISOLATION CIRCUIT

FIELD OF THE INVENTION

This invention relates to converter circuits and, in particular, to a highly accurate voltage sensing circuit, which can be used as either a voltage-to-voltage or a voltage-to-current converter circuit.

DESCRIPTION OF THE PRIOR ART

In many circuit applications, it is necessary to monitor a particular signal and also accurately reproduce the monitored signal. Typically, an operational amplifier is used for this purpose, but the operational amplifier normally requires a negative voltage source and a considerable amount of semiconductor area in an integrated circuit. There are also numerous prior art unity gain isolation amplifier circuits but these all either require extensive circuitry to implement or lack the required accuracy. Thus, one thing that is lacking from the prior art is a highly accurate converter circuit that does not require extensive circuitry to implement yet also has the flexibility to monitor a voltage and provide both accurate current and voltage outputs.

SUMMARY OF THE INVENTION

The subject circuit is a converter/isolation circuit which employs only a few components yet functions to monitor a particular signal and produce an output signal which is identical (to a high degree of accuracy) to the monitored input signal. The subject circuit can monitor a voltage and generate both a current and a voltage as output signals. In the preferred embodiment disclosed hereinbelow, a combination voltage-to-voltage and voltage-to-current situation is presented and the subject circuit functions as a unity gain isolation amplifier and a precision transconductance amplifier.

DETAILED DESCRIPTION

Figure 1:
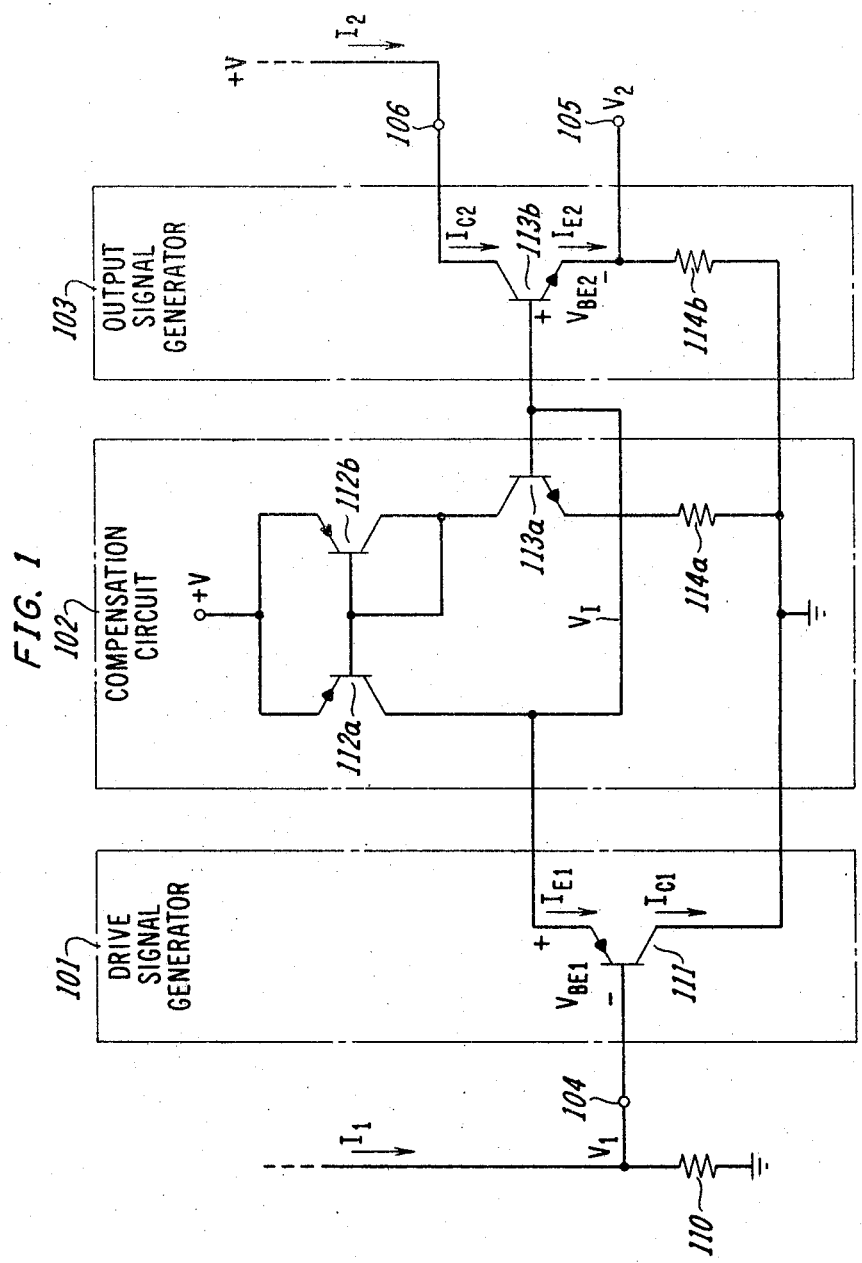
FIG. 1 illustrates the preferred embodiment of the subject converter/isolation circuit.

The subject converter/isolation circuit functions to monitor a particular voltage signal and produces an output voltage signal which is virtually identical to the signal that is monitored. In addition, the circuit converts the monitored input signal voltage to a precise output current. The subject circuit is shown in FIG. 1 and comprises three basic elements, which are: a drive signal generator 101, an output signal generator 103 and compensation circuit 102. As is illustrated in FIG. 1, the signal to be monitored, such as voltage $V_1$, is applied to input terminal 104 and drive signal generator 101 produces a drive signal, $V_I$, which signal activates output signal generator 103, thereby producing output voltage $V_2$ at output terminal 105. As is evident from the drawing, voltage $V_I$ is equal to input voltage $V_1$ plus the base-emitter voltage drop ($V_{BE1}$) across transistor 111. Output voltage $V_2$ is equal to drive signal $V_I$ less the base-emitter voltage drop ($V_{BE2}$) across transistor 113b. Therefore, for output voltage $V_2$ to match input voltage $V_1$, the base-emitter drop ($V_{BE1}$, $V_{BE2}$) across these two transistors (111, 113b) must be equal. It is this equivalence of base-emitter voltage drops that is assured by compensation circuit 102.

For the sake of clarity, assume that an input signal voltage $V_1$, is applied to terminal 104. This voltage is generated in some fashion by the circuit or system to which the subject converter/isolation circuit is connected. For illustrative purposes, a resistor 110 is shown in the monitored circuit to indicate a typical application wherein a current $I_1$ flows into resistor 110 thereby generating the signal of interest, voltage $V_1$.

It is important to note that the only error in this current-to-voltage transformation is caused by the base current of transistor 111 which flows through resistor 110 causing an increase in voltage $V_1$ which is equal to the base current times the value of resistor 110. As will be shown, the subject circuit functions to force the collector current of transistor 111 to be proportional to $V_1$. Since the base current of a transistor is proportional to its collector current, the base current of transistor 111 is therefore proportional to $V_1$. Thus, the resulting error is equivalent to a high value negative resistor in parallel with resistor 110 and this error can be completely compensated for by slightly decreasing the value of resistor 110.

Terminal 104 is directly connected to the base of transistor 111 and, therefore, voltage $V_1$ serves to bias the base of transistor 111 (which operates in the linear active region) and current flows into the emitter of transistor 111 and through the collector of transistor 111 to circuit ground. This aforementioned current flow generates a voltage $V_{BE1}$ which is the base-emitter voltage drop of transistor 111. Therefore, transistor 111 acts as a unity gain voltage amplifier and the drive signal $V_I$ at the emitter terminal of transistor 111 is the input signal voltage $V_1$ plus an error signal which is this base-emitter voltage drop $V_{BE1}$.

Drive signal voltage $V_I$ activates transistor 113b since the base of this transistor (113b) is directly connected to the emitter terminal of transistor 111. The collector of transistor 113b may be connected in any one of a number of configurations and what is shown is a connection to a source of potential designated as $+V$. With this particular connection, drive signal $V_I$ biases transistor 113b causing current to flow from the source of potential $+V$ through output terminal 106 of the subject circuit to the collector and thence to the emitter of transistor 113b where the current is returned to circuit ground through resistor 114b. Output terminal 105 is directly connected to the emitter of transistor 113b and is typically used to obtain the voltage output $V_2$ of the circuit, whereas output terminal 106 can obviously be used to obtain a current output $I_2$, which current is proportional to the voltage $V_2$. Since transistor 113b also acts as a unity gain voltage amplifier, the output voltage will be drive signal $V_I$ minus a second error signal which is the base-emitter voltage drop ($V_{BE2}$) of transistor 113b.

As was mentioned above, for the output voltage $V_2$ to match input voltage $V_1$, the base-emitter drops of transistors 111 and 113b must be identical. For this to be the case, compensation circuit 102 must function to supply transistor 111 with the identical emitter current to that flowing in transistor 113b if transistors 111 and 113b are sized for equal saturation currents. As will be described below, the base-emitter voltage drop of a transistor is a function of the collector or emitter currents flowing in that transistor and its saturation current and, therefore, if each of the two aforementioned transistors (111, 113b)

can be controlled so that their current flows are identical and their saturation currents are equal, the base-emitter voltage drops will also be identical.

Compensation circuit 102 contains a current mirror circuit comprising transistors 112a and 112b. This current mirror circuit functions in well-known fashion to supply nearly identical currents through both legs of the current mirror circuit. In FIG. 1, one leg of the circuit is connected to the emitter terminal of transistor 111 and the other leg of the current mirror circuit is connected to the collector terminal of transistor 113a. With this being the case, the current flow through the emitter and collector terminals of transistors 111 and 113a respectively will be virtually identical. Therefore, the base-emitter voltage drops of these two transistors will also be virtually identical as will be shown hereinbelow. The emitter terminal of transistor 113a is connected to circuit ground through resistor 114a. To equalize the base-emitter voltage drop of transistor 113b with that of transistor 111, some form of coupling must obviously be provided. By manufacturing transistor 113a and 113b as an identically matched pair having a common base terminal and also manufacturing resistors 114a and 114b as identically matched resistors accomplishes the necessary coupling. With this being the case, since the emitter resistors of both transistors are identical, and both collectors are connected to voltage $+V$, the current flows through both of transistors 113a and 113b will be identical, therefore achieving our stated purpose. Thus, the base-emitter voltage drops of transistor 111 and 113b will be virtually identical and will be controlled by transistor 113a and its associated current mirror circuit comprising transistors 112a and 112b.

$V_{BE}$ Equality

The detailed circuit analysis of this configuration begins with an analysis of the base-emitter voltage drop of a transistor. As is well-known from basic circuit theory as described in any standard textbook such as on page 13 of "Analysis and Design of Analog Integrated Circuits", by P. E. Gray et al published by John Wiley and Sons in 1977, the base-emitter voltage drop across a transistor is determinable from the following equation:

$$I_C = I_S \exp \frac{V_{BE}}{V_T} \quad (1)$$

where:

$I_S$ = Transistor Saturation Current (Proportional to emitter area)
$V_T$ = Transistor Thermal Voltage $$V_T = \frac{KT}{q}$$

K = Boltzmans Constant
T = Absolute Temperature
q = Electron Charge

Dividing both sides of equation (1) by $I_S$, taking the natural log of both sides, and multiplying both sides by $V_T$ gives:

$$V_{BE} = V_T \ln \frac{I_C}{I_S} \quad (2)$$

It is clear from this equation that if transistors 111 and 113b are designed to have equal saturation currents ($I_S$'s), the difference in $V_{BE}$'s between the two transistors in question will be determined by the differences in their respective collector currents. As we discussed above, the current mirror circuit and the coupling between transistors 113a and 113b guarantee that:

$$I_{E1} = I_{C2}$$

but, from basic transistor theory:

$$I_{C1} = I_{E1} - I_{B1}$$

Therefore, it is obvious from this that the difference in the base-emitter voltage drop between transistors 111 and 113b will be due solely to the small base current of transistor 111 which will be insignificant in relation to the magnitude of the emitter and collector currents flowing in this transistor. Thus, the $V_{BE}$ as specified by equation (2) above will be effectively determined by the $I_C$ term which is nearly identical for both transistors (111, 113b). Therefore, it can be said that, to a very high degree of accuracy, the base-emitter voltage drops of these two transistors are identical. Therefore, the disclosed circuit performs the required function, that is monitoring an input signal and producing an output signal which is identical to the monitored input signal.

In the discussion above, the subject circuit was described in terms of a voltage-to-voltage converter with the output of the circuit being voltage $V_2$ which was obtainable at terminal 105. However, the subject circuit also functions as a voltage-to-current converter with a current output being available at terminal 106. This output current $I_2$ is proportional to $V_2$ with the relationship being:

$$I_2 = \frac{V_2}{R_{114b}} \quad (3)$$

where $R_{114b}$ is the resistance value of resistor 114b.

But since $V_1 = V_2$ in this circuit, the current $I_2$ is given by:

$$I_2 = V_1 / R_{114b} \quad (4)$$

to a high degree of accuracy. The sources of error in this signal are the inequalities between $V_2$ and $V_1$ discussed above and also the fact that the current through resistor 114b is in actuality current $I_2$ plus the base current of transistor 113b. Thus, this base current, which is a factor of beta (of transistor 113b) smaller than current $I_2$, must be compensated for in order for equation (4) above to be precisely correct.

The circuit illustrated in FIG. 1 can be modified to reduce the error introduced by the above-mentioned sources of mismatch without altering the basic circuit structure. In particular, FIGS. 2 and 3 reveal several possible improvements and these will be discussed hereinbelow.

Figure 2:
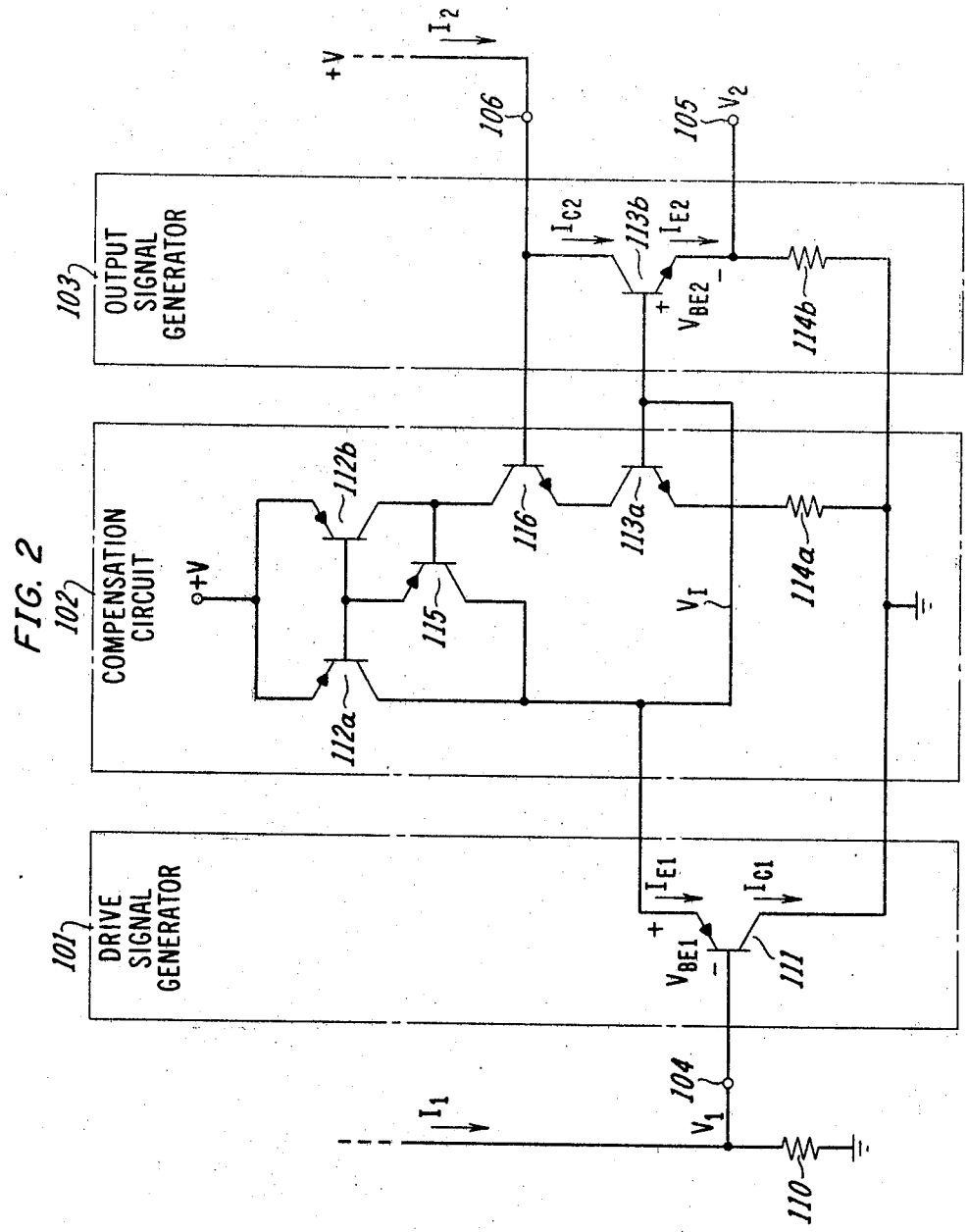
FIGS. 2 and 3 illustrate variations of the basic circuit illustrated in FIG. 1.

The circuit of FIG. 2 illustrates one method of accomplishing this current correction. Transistor 116 is added to compensation circuit 102 in series with the output leg of transistor 112b of the current mirror with the base of transistor 116 being connected to output terminal 106. The function of transistor 116 is to add a transistor base current to the collector current flowing through transistor 113b so that the output current $I_2$ becomes equal to the current flowing through resistor 114b. In particular:

$$I_2 = I_{C2} + I_{B116} \quad (5)$$

$$I_2 = I_{E2} + I_{B116} - I_{B113b} \quad (6)$$

Therefore, the current flowing through resistor 114b equals current I₂ if the base currents flowing in both transistors 116 and 113b are identical. This equality can be achieved by manufacturing the two transistors as an identically matched pair. Also, transistor 115 is added to improve the accuracy of the current mirror and add two base currents to the collector current of transistor 112a. These two base currents tend to compensate for the base currents of transistors 113a and 113b and make $I_{E1}$ more nearly equal to $I_{C2}$ so that $V_{BE1}$ will be equal to $V_{BE2}$. Once again, equality of base currents can be obtained by transistor matching.

There are numerous sources of additional error that have not been discussed above that are inherent in the fabrication of any circuit. However, these error sources are believed to be relatively insignificant in comparison to the above-described ($V_{BE}$) error signals. Thus, it is believed that it is still accurate to state that the subject circuit generates an output signal that is identical to the monitored input signal.

Figure 3:
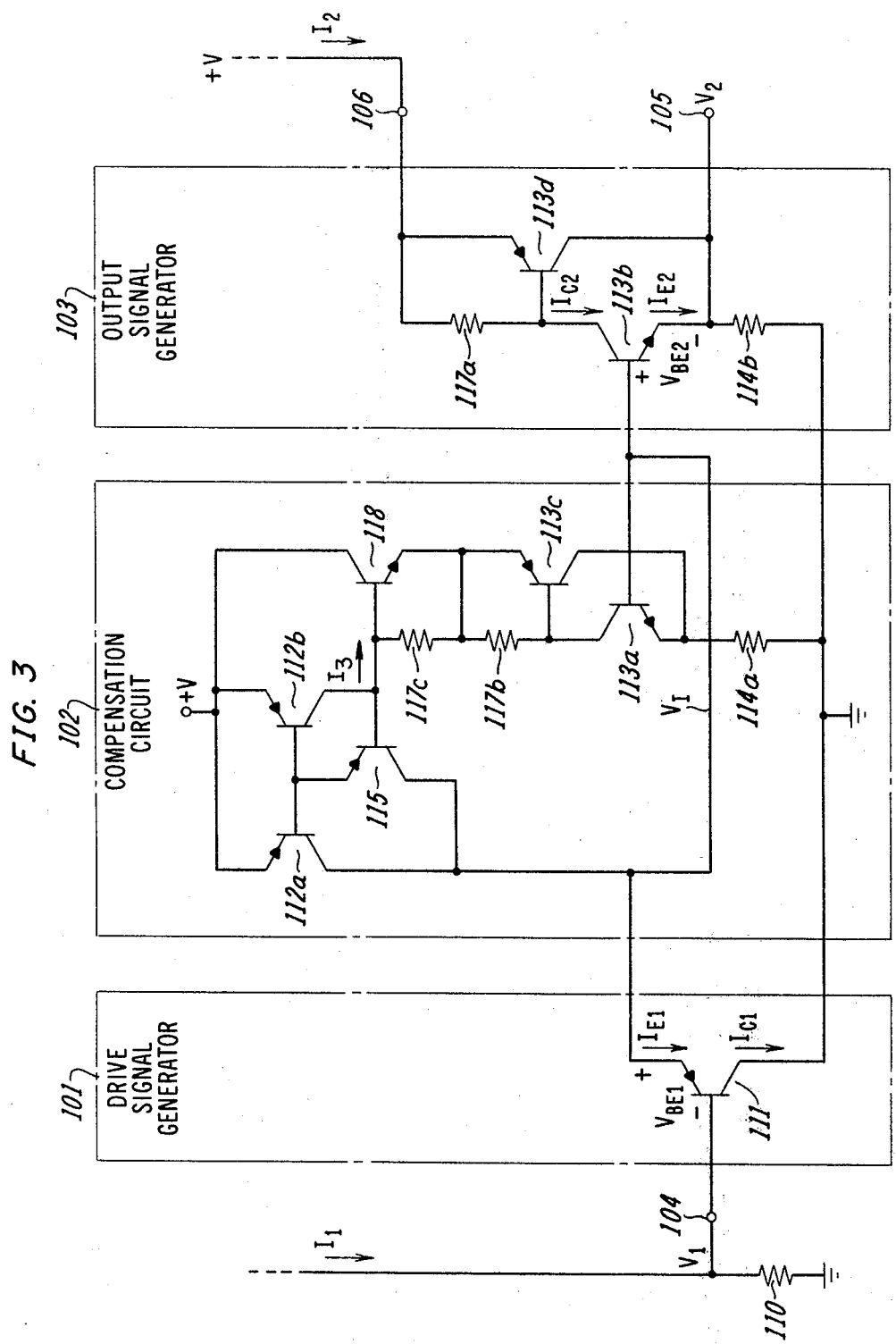

The circuit of FIG. 3 uses composite transistors and a novel compensation circuit to greatly reduce the small errors inherent in the circuit of FIG. 1 which are caused by transistor base currents. This is accomplished, in part, by adding transistor 113c and resistor 117b to transistor 113a and transistor 113d and resistor 117a to transistor 113b. This additional circuitry shown in FIG. 3 serves to replace simple transistors 113a and 113b with compound transistor configurations which function (as would several other transistor combinations) to increase the effective betas of transistors 113a and 113b. Since all of transistors 113a-113d are manufactured as an identically matched quadruple, the previously described coupling between transistors 113a and 113b is maintained and the new composite transistors now have a gain of beta squared which suffices to reduce the error caused by transistor base currents by a factor of beta over the basic circuit illustrated in FIG. 1.

One unique feature of this circuit is the arrangement of transistor 118 and resistor 117c which creates a current I₃ which is equal to the collector current of transistor 113b. This current is then mirrored by transistors 112a and 112b to supply the needed emitter current of transistor 111 to make $V_{BE1}$ equal to $V_{BE2}$. The collector current of mirror helper transistor 115 is equal to two transistor base currents and this current is also supplied to the emitter of transistor 111 and helps to compensate for the small base currents of transistors 111, 113a and 113b. Thus, the basic circuit structure of FIG. 1 can be fine-tuned to obtain the precision required.

While a specific embodiment of the invention has been disclosed, variations in structural detail, within the scope of the appended claims, are possible and are contemplated. There is no intention of limitation to what is contained in the abstract or the exact disclosure as herein presented. The above-described arrangements are only illustrative of the application of the principles of the invention. Normally, other arrangements may be devised by those skilled in the art without departing from the spirit and the scope of the invention.

We claim:

1. A converter circuit which generates an output signal ($V_2$) which is identical to a monitored input signal ($V_1$) characterized by:

first generating means (101) responsive to the receipt of said input signal ($V_1$) for generating a drive signal ($V_J$) which contains the following components: a first error signal ($V_{BE1}$) and said input signal ($V_1$);

second generating means (103) connected to said first generating means (101) and responsive to said drive signal ($V_J$) for generating an output signal ($V_2$) which contains the following components: a second error signal ($V_{BE2}$) and said drive signal ($V_J$), wherein said second error signal ($V_{BE2}$) is in the opposite sense of said first error signal ($V_{BE1}$);

compensation means (102) connected to both said first (101) and said second (103) generating means and responsive to said drive signal ($V_J$) for equalizing said second error signal ($V_{BE2}$) and said first error signal ($V_{BE1}$), to thereby cancel each other in said output signal ($V_2$).

2. The invention of claim 1 characterized in that said compensation means includes:

matched current generating means (112a, 112b) directly connected to said first generating means (101) and responsive to said drive signal ($V_J$) for generating a first and a second matched currents and for applying said first matched current to said first generating means (101);

coupling means (113a) connected to both said matched current generating means (112a, 112b) and said second generating means (103), responsive to said second matched current for controlling the magnitude of said second error signal ($V_{BE2}$); and wherein said first generating means (101) are responsive to said first matched current for controlling the magnitude of said first error signal ($V_{BE1}$).

3. The invention of claim 2 characterized in that said first generating means (101) comprises a first unity gain isolation amplifier (111), responsive to said input signal ($V_1$) for generating a drive signal which comprises said first error signal ($V_{BE1}$) and said input signal ($V_1$).

4. The invention of claim 3 characterized in that said second generating means (103) comprises a second unity gain isolation amplifier (113b), responsive to said drive signal ($V_J$) for generating an output signal ($V_2$) comprising: said input signal ($V_1$), said first error signal ($V_{BE1}$), and said second error signal ($V_{BE2}$).

5. The invention of claim 4 characterized in that said first unity gain isolation amplifier (111) comprises a voltage amplifier consisting of a PNP transistor (111) connected in the common collector mode with the base terminal connected to said input signal ($V_1$) and the emitter terminal connected to said second generating means (103) and said drive signal ($V_J$) comprises a voltage equal to said input signal ($V_1$) plus the base-emitter voltage drop ($V_{BE1}$) of said PNP transistor (111).

6. The invention of claim 5 characterized in that said second unity gain isolation amplifier (113b) comprises a NPN transistor (113b) connected in the common emitter mode with the base terminal connected to said emitter of said PNP transistor (111), the emitter terminal connected to circuit output (105), and said output signal ($V_2$) comprises a voltage equal to said drive signal ($V_J$) and the base-emitter voltage drop ($V_{BE2}$) of said NPN transistor (113b).

7. The invention of claim 6 characterized in that said matched current generating means (112a, 112b) comprises current mirror means (112a, 112b) for generating said first and said second matched currents.

8. The invention of claim 7 characterized in that said coupling means 113a includes a second NPN transistor (113a) connected in the common emitter mode with the base terminal connected to said emitter terminal of said PNP transistor (111), wherein the base-emitter voltage drop of said second NPN transistor (113a) is matched to the base-emitter voltage drop ($V_{BE2}$) of said first NPN transistor (113b).

9. The invention of claim 8 characterized in that one leg (112b) of said current mirror means is connected to said collector terminal of said second NPN transistor (113a) for supplying said second NPN transistor (113a) with said second matched current and the other leg (112a) of said current mirror means is connected to said emitter terminal of said PNP transistor (111) for supplying said PNP transistor (111) with said first matched current;

wherein said PNP transistor (111) and said second NPN transistor (113a) are responsive to said first and said second matched currents respectively for equalizing the base-emitter voltage drops ($V_{BE1}$, $V_{BE2}$) of both said PNP (111) and said second NPN (113a) transistors.

10. The invention of claim 9 characterized in that said compensation means (102) includes first impedance means (114a) connected between said emitter terminal of said second NPN transistor (113a) and circuit ground;

said second generating means (103) includes second impedance means (114b) equal in value to said first impedance means (114a) connected in series with said emitter terminal of said first NPN transistor (113b) for providing identical emitter to ground voltages for both said first (113b) and said second (113a) NPN transistors.

11. A converter circuit which generates an output signal ($V_2$) identical to a monitored input signal ($V_1$) characterized by:

PNP transistor means (111) for generating a drive signal ($V_I$) at the emitter of said PNP transistor means (111) comprising said monitored input signal ($V_1$) and a first error signal ($V_{BE1}$), wherein said PNP transistor means (111) is connected in a common collector configuration with the base of said PNP transistor means (111) being connected to said monitored input signal ($V_1$);

NPN transistor means (113b) responsive to said drive signal ($V_I$) for generating an output comprising said drive signal ($V_I$) and a second error signal ($V_{BE2}$), with said second error signal ($V_{BE2}$) being in the opposite sense of said first error signal ($V_{BE1}$), wherein said NPN transistor means (113b) is connected in the common emitter configuration with the base of said NPN transistor means (113b) being connected to the emitter of said PNP transistor means (111), and the collector of said NPN transistor means (113b) being connected to a source of power (+V); and compensation means (102) connected to said base of said NPN transistor means (113b) for equalizing said first ($V_{BE1}$) and said second ($V_{BE2}$) error signals such that said NPN transistor means (113b) generates an output ($V_2$) comprising said input signal ($V_1$).

12. A converter circuit which generates an output signal ($I_2$) which is directly proportional to a monitored input signal ($V_1$) characterized by:

first generating means (101) responsive to the receipt of said input signal ($V_1$) for generating a drive signal ($V_I$) which contains the following components: a first error signal ($V_{BE1}$) and said input signal ($V_1$);

second generating means (103) connected to said first generating means (101) and responsive to said drive signal ($V_I$) for generating an output signal ($I_2$) which is proportional to an intermediate signal $V_2$ which contains the following components: A second error signal ($V_{BE2}$) and said drive signal ($V_I$), wherein said second error signal ($V_{BE2}$) is in the opposite sense of said first error signal ($V_{BE1}$);

compensation means (102) connected to both said first (101) and said second (103) generating means and responsive to said drive signal ($V_I$) for equalizing said second error signal ($V_{BE2}$) and said first error signal ($V_{BE1}$), to thereby cancel each other in said intermediate signal ($V_2$).

13. The invention of claim 12 characterized in that said compensation means includes:

matched current generating means (112a, 112b) directly connected to said first generating means (101) and responsive to said drive signal ($V_I$) for generating a first and a second matched currents and for applying said first matched current to said first generating means (101);

coupling means (113a) connected to both said matched current generating means (112a, 112b) and said second generating means (103), responsive to said second matched current for controlling the magnitude of said second error signal ($V_{BE2}$); and wherein said first generating means (101) are responsive to said first matched current for controlling the magnitude of said first error signal ($V_{BE1}$).

14. The invention of claim 13 characterized in that said first generating means (101) comprises a unity gain isolation amplifier (111) consisting of a PNP transistor (111) connected in the common collector mode with the base terminal connected to said input signal ($V_1$) and the emitter terminal connected to said second generating means (103) responsive to said input signal ($V_1$) for generating said drive signal ($V_I$) comprising a voltage equal to said input signal ($V_1$) plus the base-emitter voltage drop ($V_{BE1}$) of said PNP transistor (111).

15. The invention of claim 14 characterized in that said second generating means (103) comprises a unity gain isolation amplifier (113b) consisting of a NPN transistor (113b) connected in the common emitter mode with the base terminal connected to said emitter of said PNP transistor (111), the emitter terminal connected to circuit output (105), responsive to said drive signal ($V_I$) for gennerating said output signal ($I_2$) comprising a current directly proportional to said drive signal ($V_I$) and the base-emitter voltage drop ($V_{BE2}$) of said NPN transistor (113b).

16. The invention of claim 15 characterized in that said matched current generating means (112a, 112b) comprises current mirror means (112a, 112b) for generating said first and said second matched currents.

17. The invention of claim 16 characterized in that said coupling means (113a) includes a second NPN transistor (113a) connected in the common emitter mode with the base terminal connected to said emitter terminal of said PNP transistor (111), wherein the base-emitter voltage drop of said second NPN transistor (113a) is matched to the base-emitter voltage drop ($V_{BE2}$) of said first NPN transistor (113b).

18. The invention of claim 17 characterized in that one leg (112b) of said current mirror means is connected to said collector terminal of said second NPN transistor (113a) for supplying said second NPN transistor (113a) with said second matched current and the other leg (112a) of said current mirror means is connected to said emitter terminal of said PNP transistor (111) for supplying said PNP transistor (111) with said first matched current;

wherein said PNP transistor (111) and said second NPN transistor (113a) are responsive to said first and said second matched currents respectively for equalizing the base-emitter voltage drops ($V_{BE1}$, $V_{BE2}$) of both said PNP (111) and said second NPN (113a) transistors.

19. The invention of claim 18 characterized in that said compensation means (102) includes first impedance means (114a) connected between said emitter terminal of said second NPN transistor (113a) and circuit ground;

said second generating means (103) includes second impedance means (114b) equal in value to said first impedance means (114a) connected in series with said emitter terminal of said first NPN transistor (113b) for providing identical emitter to ground voltages for both said first (113b) and said second (113a) NPN transistors.

* * * * *